(12) United States Patent
Noble et al.

(10) Patent No.: US 11,566,780 B1
(45) Date of Patent: Jan. 31, 2023

(54) LIGHT EMITTING DIODE LIGHTING SYSTEM

(71) Applicants: Latesha Noble, Chula Vista, CA (US); Muhammad Talha Saleem, Karachi (PK); Adnan Ghoury Javed, Lahore Cantt (PK); Adesola Akindele, London (GB)

(72) Inventors: Latesha Noble, Chula Vista, CA (US); Muhammad Talha Saleem, Karachi (PK); Adnan Ghoury Javed, Lahore Cantt (PK); Adesola Akindele, London (GB)

(73) Assignee: HYGEAR TECHNOLOGIES INC., Chula Vista, CA (US)

( * ) Notice: Subject to any disclaimer, the term of this patent is extended or adjusted under 35 U.S.C. 154(b) by 0 days.

(21) Appl. No.: 17/585,325

(22) Filed: Jan. 26, 2022

Related U.S. Application Data

(60) Provisional application No. 63/141,814, filed on Jan. 26, 2021.

(51) Int. Cl.
| | |
|---|---|
| *F21V 23/00* | (2015.01) |
| *H05B 45/20* | (2020.01) |
| *F21V 23/06* | (2006.01) |
| *F21Y 115/10* | (2016.01) |

(52) U.S. Cl.
CPC ............ *F21V 23/003* (2013.01); *F21V 23/06* (2013.01); *H05B 45/20* (2020.01); *F21Y 2115/10* (2016.08)

(58) Field of Classification Search
CPC ........ H01L 33/48; F21V 23/003; H05B 45/20
See application file for complete search history.

(56) References Cited

U.S. PATENT DOCUMENTS

2021/0320230 A1\* 10/2021 Hsieh ...................... H01L 33/60

\* cited by examiner

*Primary Examiner* — Karabi Guharay
(74) *Attorney, Agent, or Firm* — Plager Schack LLP; Mark H. Plager; Michael J. O'Brien

(57) ABSTRACT

A light emitting diode lighting system has a base arranged as a cylinder further comprising a pair of arcuate extensions having a pair of arcuate openings therebetween. Electrical tracks are joined to the base. A semiconductor substrate is arranged around an out surface of the base and connected to the electrical tracks. A polymeric housing is joined to the base and housing the electrical tracks. A germanium layer and a silicon layer are joined to the semiconductor substrate. An outer layer is joined to the germanium layer and the silicon layer and configured to dissipate heat from the germanium layer and the silicon layer. An outer module is joined to the outer layer, and configured to mount the light emitting diode lighting system into an external housing.

4 Claims, 3 Drawing Sheets

LIGHT EMITTING DIODE LIGHTING SYSTEM

RELATED APPLICATION

This application claims priority to provisional patent application U.S. Ser. No. 63/141,814 filed on Jan. 26, 2021, the entire contents of which is herein incorporated by reference.

BACKGROUND

The embodiments herein relate generally to electronics and electrical engineering.

Prior to embodiments of the disclosed invention small size germicidal far short-wave ultraviolet LEDs (FAR UVC LEDs) did not exist. Embodiments of the disclosed invention solve this problem.

SUMMARY

A light emitting diode lighting system has a base arranged as a cylinder further comprising a pair of arcuate extensions having a pair of arcuate openings therebetween. Electrical tracks are joined to the base. A semiconductor substrate is arranged around an out surface of the base and connected to the electrical tracks. A polymeric housing is joined to the base and housing the electrical tracks. A germanium layer and a silicon layer are joined to the semiconductor substrate. An outer layer is joined to the germanium layer and the silicon layer and configured to dissipate heat from the germanium layer and the silicon layer. An outer module is joined to the outer layer, and configured to mount the light emitting diode lighting system into an external housing.

In some embodiments, a controller is joined to the electrical tracks. In a first mode of operation, electrical current on the electrical tracks causes a Vacuum-UV wavelength 100-206 nm light to be emitted from the light emitting diode lighting system. In a second mode of operation, electrical current on the electrical tracks causes a Far UV-C of wavelength 207-222 nm light to be emitted from the light emitting diode lighting system.

BRIEF DESCRIPTION OF THE FIGURES

The detailed description of some embodiments of the invention is made below with reference to the accompanying figures, wherein like numerals represent corresponding parts of the figures.

DETAILED DESCRIPTION OF CERTAIN EMBODIMENTS

Figure 1:
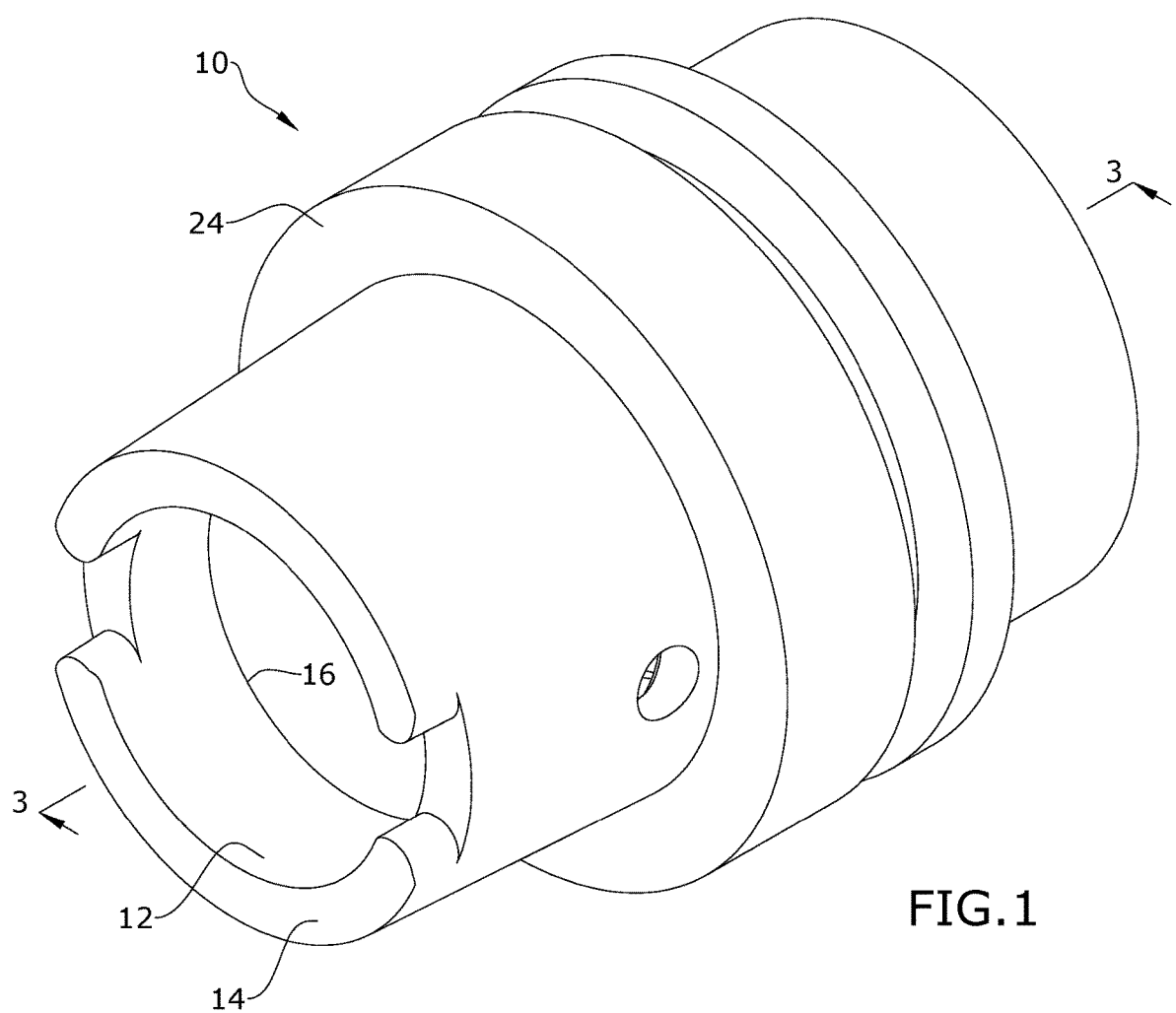
FIG. 1 shows a perspective view of one embodiment of the present invention.
Figure 2:
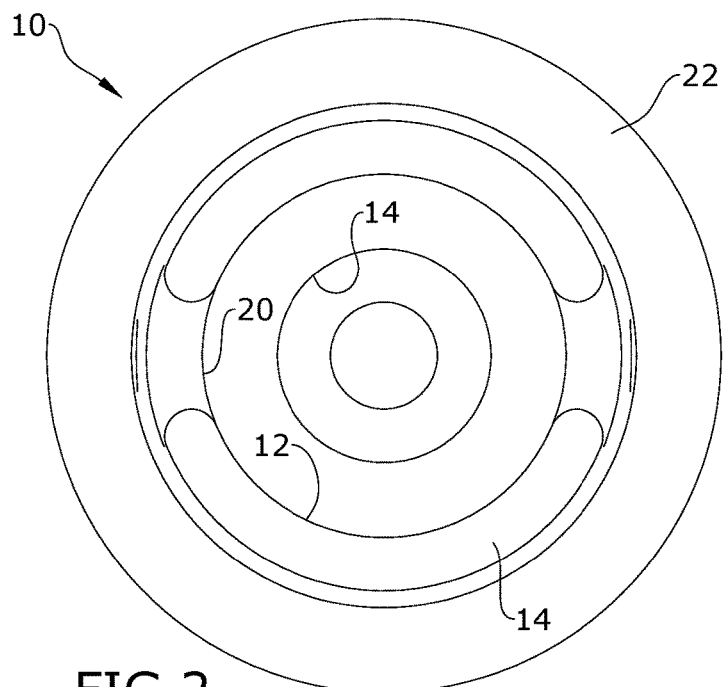
FIG. 2 shows a side view of one embodiment of the present invention.
Figure 3:
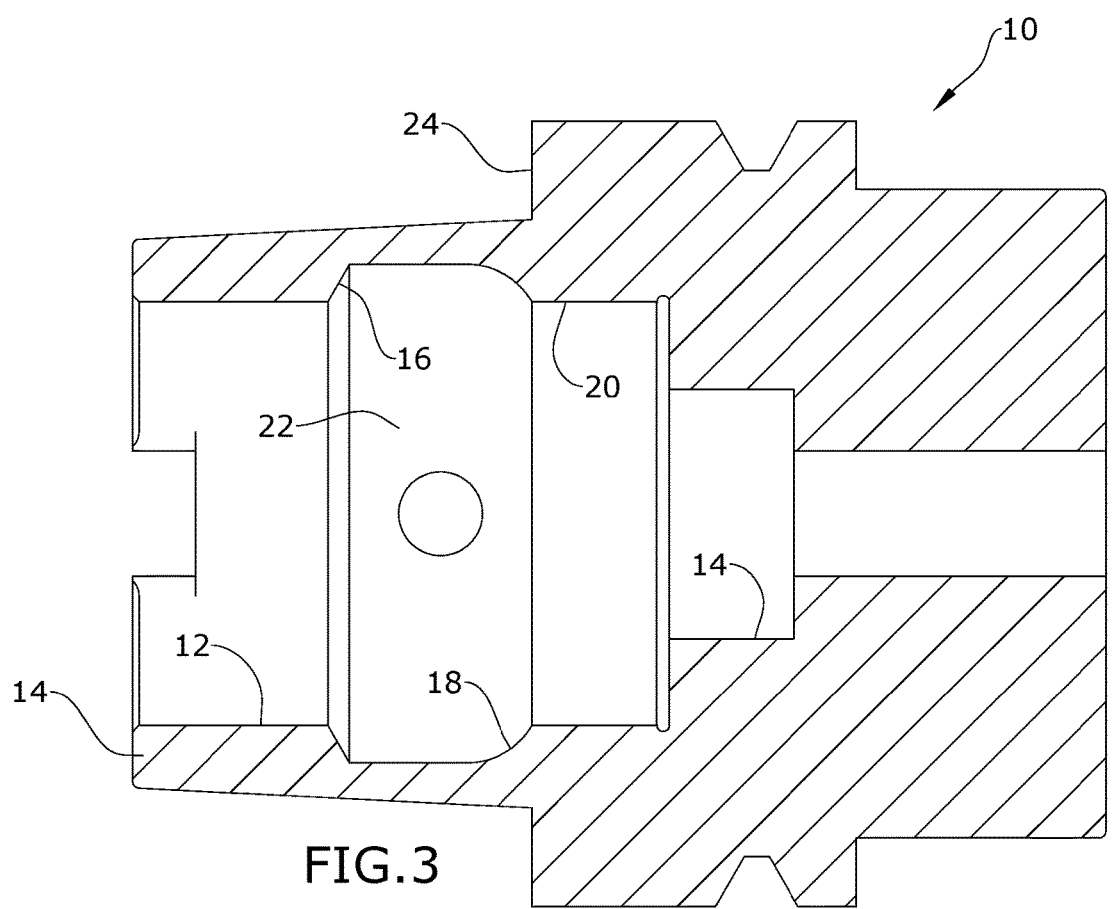
FIG. 3 shows a section view of one embodiment of the present invention taken along line 3-3 in FIG. 1.
Figure 4:
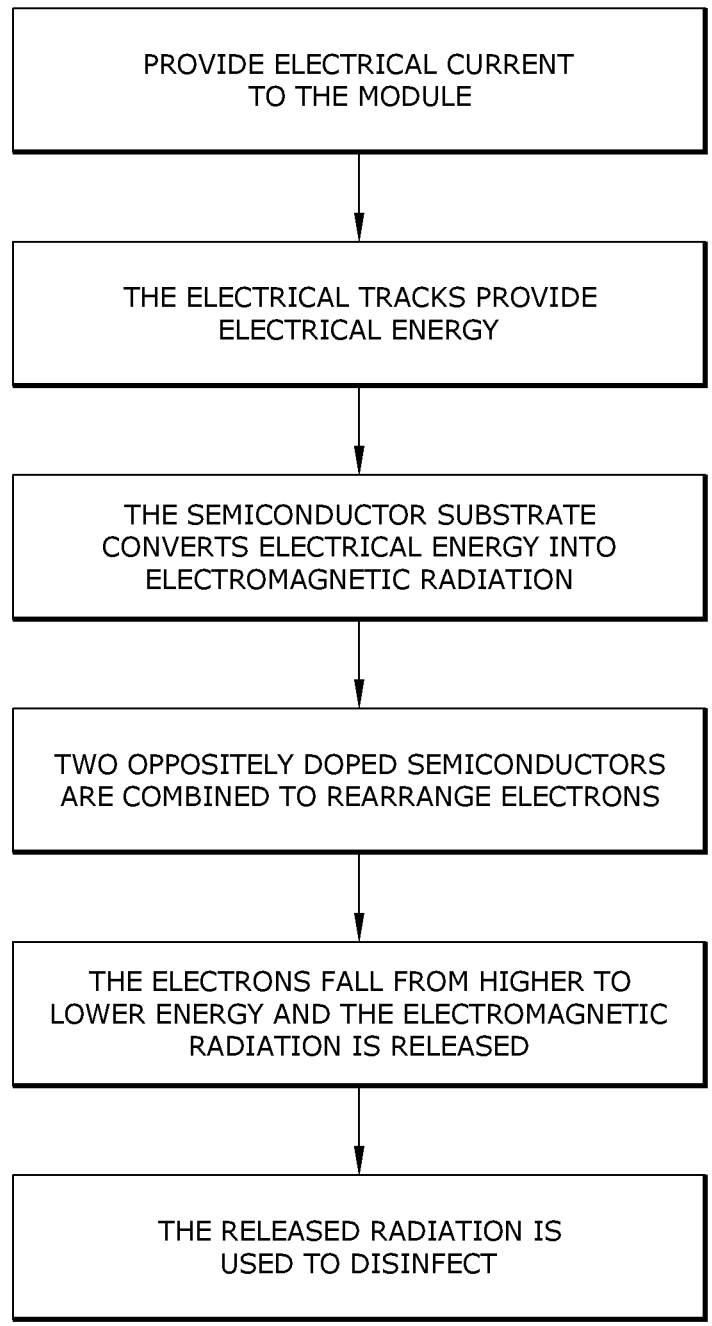
FIG. 4 shows a flow chart of one embodiment of the present invention.

By way of example, and referring to FIG. 1, one embodiment of a light emitting diode lighting system 10 has a base 12 arranged as a cylinder further comprising a pair of arcuate extensions having a pair of arcuate openings therebetween. Electrical tracks 16 are joined to the base. A semiconductor substrate 14 is arranged around an out surface of the base 12 and connected to the electrical tracks 16. A polymeric housing 18 is joined to the base 12, and housing the electrical tracks 16. A germanium layer 20 and a silicon layer 20 are joined to the semiconductor substrate 14. An outer layer 22 is joined to the germanium layer 20 and the silicon layer 20 and configured to dissipate heat from the germanium layer 20 and the silicon layer 20. An outer module 24 is joined to the outer layer 22, and configured to mount the light emitting diode lighting system 10 into an external housing In some embodiments, a controller is joined to the electrical tracks 16. In a first mode of operation, electrical current on the electrical tracks 16 causes a Vacuum-UV wavelength 100-206 nm light to be emitted from the light emitting diode lighting system. In a second mode of operation, electrical current on the electrical tracks 16 causes a Far UV-C of wavelength 207-222 nm light to be emitted from the light emitting diode lighting system.

As used in this application, the term "a" or "an" means "at least one" or "one or more."

As used in this application, the term "about" or "approximately" refers to a range of values within plus or minus 10% of the specified number.

As used in this application, the term "substantially" means that the actual value is within about 10% of the actual desired value, particularly within about 5% of the actual desired value and especially within about 1% of the actual desired value of any variable, element or limit set forth herein.

All references throughout this application, for example patent documents including issued or granted patents or equivalents, patent application publications, and non-patent literature documents or other source material, are hereby incorporated by reference herein in their entireties, as though individually incorporated by reference, to the extent each reference is at least partially not inconsistent with the disclosure in the present application (for example, a reference that is partially inconsistent is incorporated by reference except for the partially inconsistent portion of the reference).

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Any element in a claim that does not explicitly state "means for" performing a specified function, or "step for" performing a specified function, is not to be interpreted as a "means" or "step" clause as specified in 35 U.S.C. § 112, ¶6. In particular, any use of "step of" in the claims is not intended to invoke the provision of 35 U.S.C. § 112, ¶6.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:
1. A light emitting diode lighting system, comprising:
 a base arranged as a cylinder further comprising a pair of arcuate extensions having a pair of arcuate openings therebetween;
 electrical tracks, joined to the base;

a semiconductor substrate, arrange around an out surface of the base and connected to the electrical tracks;

a polymeric housing, joined to the base, and housing the electrical tracks;

a germanium layer and a silicon layer, joined to the semiconductor substrate;

an outer layer, joined to the germanium layer and the silicon layer and configured to dissipate heat from the germanium layer and the silicon layer;

an outer module, joined to the outer layer, and configured to mount the light emitting diode lighting system into an external housing.

2. The light emitting diode lighting system of claim 1, further comprising a controller joined to the electrical tracks.

3. The light emitting diode lighting system of claim 2, wherein a first mode of operation, electrical current on the electrical tracks causes a Vacuum-UV wavelength 100-206 nm light to be emitted from the light emitting diode lighting system.

4. The light emitting diode lighting system of claim 2, wherein a second mode of operation, electrical current on the electrical tracks causes a Far UV-C of wavelength 207-222 nm light to be emitted from the light emitting diode lighting system.

* * * * *